(12) United States Patent
Kamiyama et al.

(10) Patent No.: US 7,985,964 B2
(45) Date of Patent: Jul. 26, 2011

(54) LIGHT-EMITTING SEMICONDUCTOR DEVICE

(75) Inventors: Satoshi Kamiyama, Nagoya (JP); Hiroshi Amano, Nagoya (JP); Isamu Akasaki, Nagoya (JP); Motoaki Iwaya, Inazawa (JP)

(73) Assignee: Meijo University, Nagoya-shi, Aichi-ken (JP)

( * ) Notice: Subject to any disclaimer, the term of this patent is extended or adjusted under 35 U.S.C. 154(b) by 0 days.

(21) Appl. No.: 12/313,123

(22) Filed: Nov. 17, 2008

(65) Prior Publication Data

US 2009/0065763 A1 Mar. 12, 2009

Related U.S. Application Data

(63) Continuation of application No. PCT/JP2007/060549, filed on May 23, 2007.

(30) Foreign Application Priority Data

May 23, 2006 (JP) ................................. 2006-142853

(51) Int. Cl.
*H01L 29/06* (2006.01)
*H01L 31/00* (2006.01)

(52) U.S. Cl. ................. 257/12; 257/13; 257/14; 257/30; 257/E33.008; 257/E33.011

(58) Field of Classification Search .......................... None
See application file for complete search history.

(56) References Cited

U.S. PATENT DOCUMENTS

| 6,526,082 | B1 | 2/2003 | Corzine et al. |
| 2002/0179918 | A1 | 12/2002 | Sung et al. |
| 2003/0116767 | A1* | 6/2003 | Kneissl et al. ................. 257/79 |
| 2004/0066816 | A1* | 4/2004 | Collins et al. ................. 372/44 |
| 2005/0023549 | A1 | 2/2005 | Gardner et al. |
| 2005/0179045 | A1 | 8/2005 | Ryu et al. |
| 2005/0184305 | A1 | 8/2005 | Ueda |
| 2005/0208686 | A1* | 9/2005 | Ryu et al. ........................ 438/21 |
| 2007/0170596 | A1* | 7/2007 | Wen et al. ...................... 257/777 |
| 2007/0176531 | A1* | 8/2007 | Kinoshita et al. ............. 313/486 |

FOREIGN PATENT DOCUMENTS

| EP | 1403935 A | 3/2004 |
| GB | 2428681 A | 2/2007 |
| JP | 2000-182542 A | 6/2000 |
| JP | 2003-60236 A | 2/2003 |
| JP | 2003-060236 A | 2/2003 |
| JP | 2005-187791 A | 7/2005 |

(Continued)

OTHER PUBLICATIONS

Guo et al. "A Bilayer Ti/Ag ohmic contact for highly doped n-type GaN films," Appl. Phys. Lett. 68 (92), Jan. 8, 1996.*

(Continued)

*Primary Examiner* — Julio J Maldonado
*Assistant Examiner* — Shaka Scarlett
(74) *Attorney, Agent, or Firm* — Yokoi & Co., U.S.A., Inc.; Toshiyuki Yokoi

(57) ABSTRACT

The present invention discloses a light-emitting semiconductor device, includes: a first electrode that is made of a high reflective metal; a second electrode; a tunnel junction layer coupling to the first electrode through a first ohmic contact and generating a tunnel current by applying a reverse bias voltage between the first electrode and the second electrode; a light-emitting layer provided between the tunnel junction layer and the second electrode.

1 Claim, 5 Drawing Sheets

FOREIGN PATENT DOCUMENTS

| | | | |
|---|---|---|---|
| JP | 2005-187791 A | | 7/2005 |
| JP | 2005-203618 A | | 7/2005 |
| JP | 2005-203618 A | | 7/2005 |
| JP | 2005187791 A | * | 7/2005 |
| JP | 2005-229085 A | | 8/2005 |
| JP | 2005-229085 A | | 8/2005 |
| JP | 2005-268739 A | | 9/2005 |
| JP | 2006-024750 A | | 1/2006 |
| JP | 2006-024750 A | | 1/2006 |
| JP | 2006-041498 A | | 2/2006 |
| JP | 2006-041498 A | | 2/2006 |
| JP | 2006-080475 A | | 3/2006 |
| JP | 2006-120731 A | | 5/2006 |
| JP | 2006-120731 A | | 5/2006 |
| JP | 2006-135311 A | | 5/2006 |
| KR | 100533645 | | 11/2005 |
| WO | 01/24285 A | | 4/2001 |
| WO | 2005/090515 | | 9/2005 |
| WO | WO 2005/090515 A | | 9/2005 |
| WO | WO2006/001462 A | | 1/2006 |

OTHER PUBLICATIONS

International Search Report for PCT/JP2007/060549 dated May 23, 2007.

German Office Action dated Mar. 4, 2011.

United Kingdom Office Action dated Apr. 8, 2011.

* cited by examiner

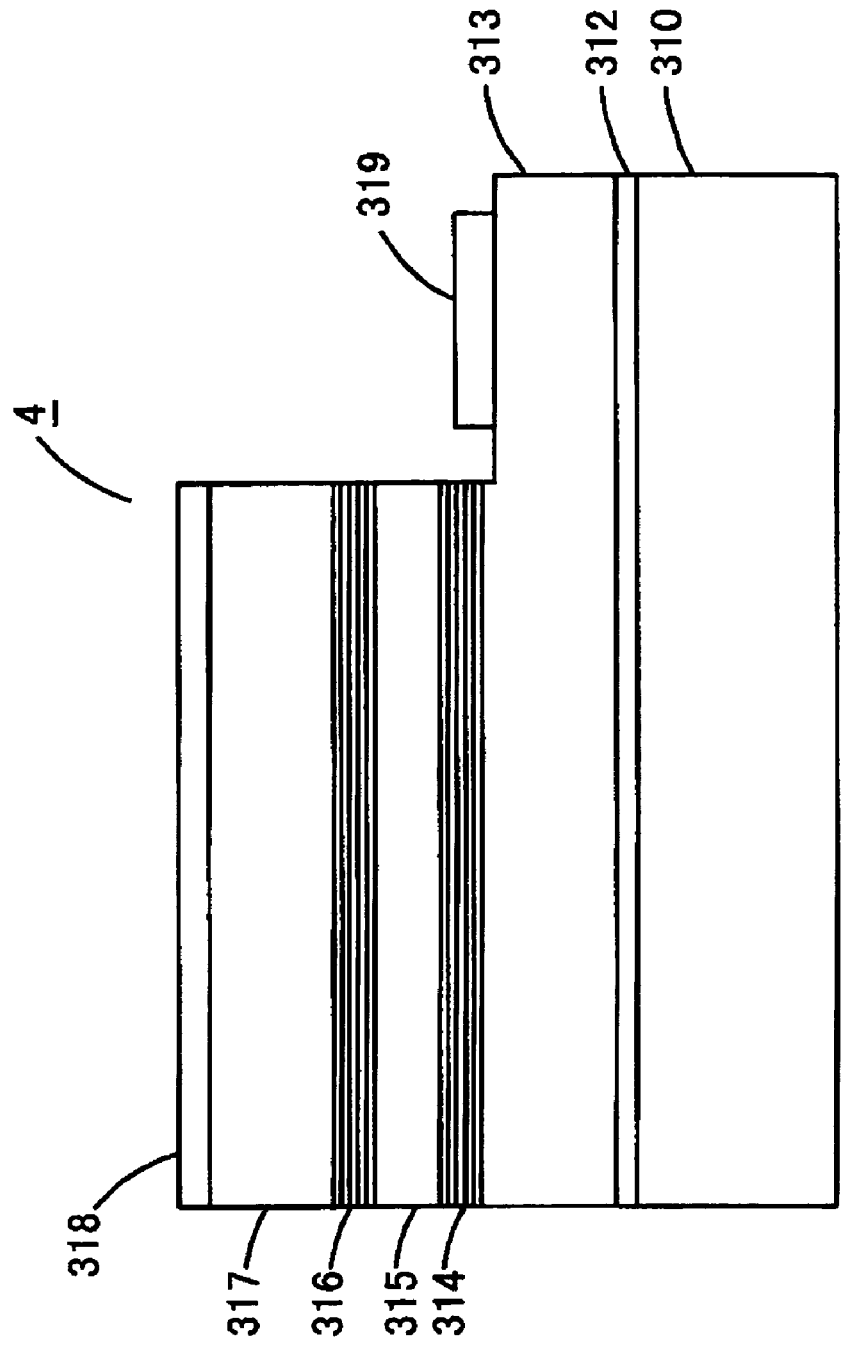

US 7,985,964 B2

LIGHT-EMITTING SEMICONDUCTOR DEVICE

CROSS-REFERENCES TO RELATED APPLICATIONS

This Application claims the benefit of priority and is a Continuation application of the prior International Patent Application No. PCT/JP2007/060549, with an international filing date of Nov. 14, 2006, which designated the United States, and is related to the Japanese Patent Application No. 2006-142853, filed May 23, 2007, the entire disclosures of all applications are expressly incorporated by reference in their entirety herein.

BACKGROUND OF THE INVENTION (1) Field of the Invention

The present invention relates to a light-emitting semiconductor device.

(2) Description of the Related Art

Light-emitting diodes disclosed in, for example, Patent documents JP2000-182542 and U.S. Pat. No. 6,526,082 have a tunnel junction of GaN, and an anode placed in ohmic contact on the tunnel junction.

The tunnel junction enables light emission at a low voltage as well as formation of an anode and a cathode made of the same material. Therefore those electrodes can be efficiently manufactured. Electrodes mentioned in JP2000-182542 and capable of satisfactorily coming into ohmic contact with the GaN tunnel junction are made of AuGe/Ni.

In the light-emitting diode, the electrode is used as a reflecting surface to guide light in a light-emitting direction and to emit the light reflected by the electrode efficiently. Although light can be emitted at a high efficiency when the electrode has a higher reflectivity, the AuGe/Ni cannot form an electrode having a high reflectivity. Thus, the light-emitting diode provided with electrodes of AuGe/Ni cannot emit light at a high efficiency.

BRIEF SUMMARY OF THE INVENTION

The present invention discloses a light-emitting semiconductor device, includes: a first electrode that is made of a high reflective metal; a second electrode; a tunnel junction layer coupling to the first electrode through a first ohmic contact and generating a tunnel current by applying a reverse bias voltage between the first electrode and the second electrode; a light-emitting layer provided between the tunnel junction layer and the second electrode.

These and other features, aspects, and advantages of invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and the drawings are to be used not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

FIG. 5 is an exemplary typical side elevation of a daylight light-emitting diode.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Preferred embodiments of the present invention will be described in the following order.

(1) First Embodiment
(2) Second Embodiment
(3) Third Embodiment
(4) Conclusion

(1) First Embodiment

Figure 1:
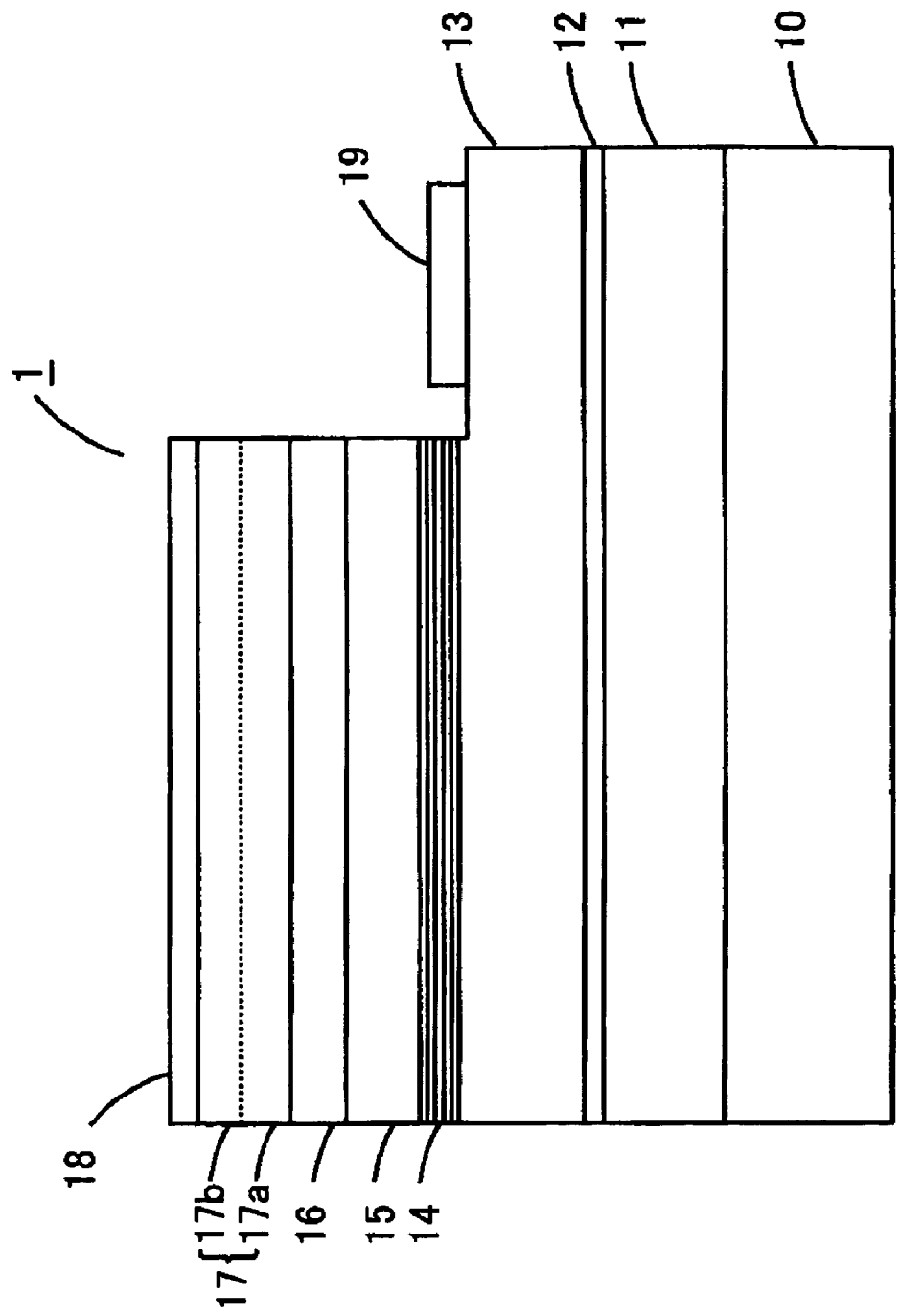
FIG. 1 is an exemplary typical side elevation of a daylight light-emitting diode.

FIG. 1 is a typical view of a daylight light emitting diode, namely, a light-emitting semiconductor device in a first embodiment according to the present invention. Referring to FIG. 1, a daylight light-emitting diode 1 includes a fluorescent substrate 10, a fluorescent layer 1, a buffer layer 12, an n-type contact layer 13, a multiple-quantum-well active layer 14, an electron blocking layer 15, a p-type connecting layer 16, a tunnel-junction layer 17, an anode 18, and a cathode 19. The anode 18 and the cathode 19 are a first electrode and a second electrode, respectively, of the present invention. A substantially plate-shaped fluorescent substrate 10 forming the lowermost layer is a 6H-type SiC single crystal. The fluorescent substrate 10 contains B (boron), namely, an acceptor impurity, and N (nitrogen), namely, a donor impurity. The fluorescent substrate 10 has a B atom and an N atom concentration in the range of about $10^{17}$ to about $10^{19}$ cm$^{-3}$.

The fluorescent layer 11 is formed on the fluorescent substrate 10. The fluorescent layer 11, similarly to the fluorescent substrate 10, is a 6H-type SiC single crystal and contains N, namely, a donor impurity, and Al (aluminum), namely, an acceptor impurity. The fluorescent layer 11 has a B atom and an Al atom concentration in the range of about $10^{17}$ to about $10^{19}$ cm$^{-3}$. The buffer layer 12 overlies the fluorescent layer 11 and is formed of AlGaN. The n-type contact layer 13 overlies the buffer layer 12 and is formed of n-GaN. The multiple-quantum-well active layer 14 overlies the n-type contact layer 13 and is formed of GaInN/GaN in multiple-quantum-well construction. The electron blocking layer 15 overlies the multiple-quantum-well active layer 14 and is formed of p-AlGaN. The multiple-quantum-well active layer 14 and the electron blocking layer 15 are light-emitting layers in the present invention. The p-type connecting layer 16 overlies the electron blocking layer 15 and is formed of p-GaN.

The tunnel junction layer 17 overlies the p-type connecting layer 16 and consists of a p-type semiconductor layer 17a and an n-type semiconductor layer 17b. The p-type semiconductor layer 17a overlies the p-type connecting layer 16 and is formed of p$^+$-GaN. The p-type semiconductor layer 17a contains Mg, namely, an acceptor impurity, in a concentration not lower than $10^{19}$ cm$^{-3}$. Thus, the p-type semiconductor layer 17a has a high carrier concentration. The n-type semiconductor layer 17b overlies the p-type semiconductor layer 17a, is formed of n⁺-GaInN, and contains Si, namely, a donor impurity, in a concentration not lower than $10^{19}$ cm$^{-3}$. Thus, the n-type semiconductor layer 17b has a high carrier concentration. The n-type semiconductor layer 17b contains InN in a molar fraction of 25% and has a thickness of 20 nm. The anode 18 overlies the n-type semiconductor layer 17b of the tunnel-junction layer 17. The cathode 19 is formed on the n-type contact layer 13. The semiconductor layers 10 to 17 of the daylight light-emitting diode 1, excluding the fluorescent substrate 10 and the fluorescent layer 11, are formed of nitride semiconductors.

Figure 2:
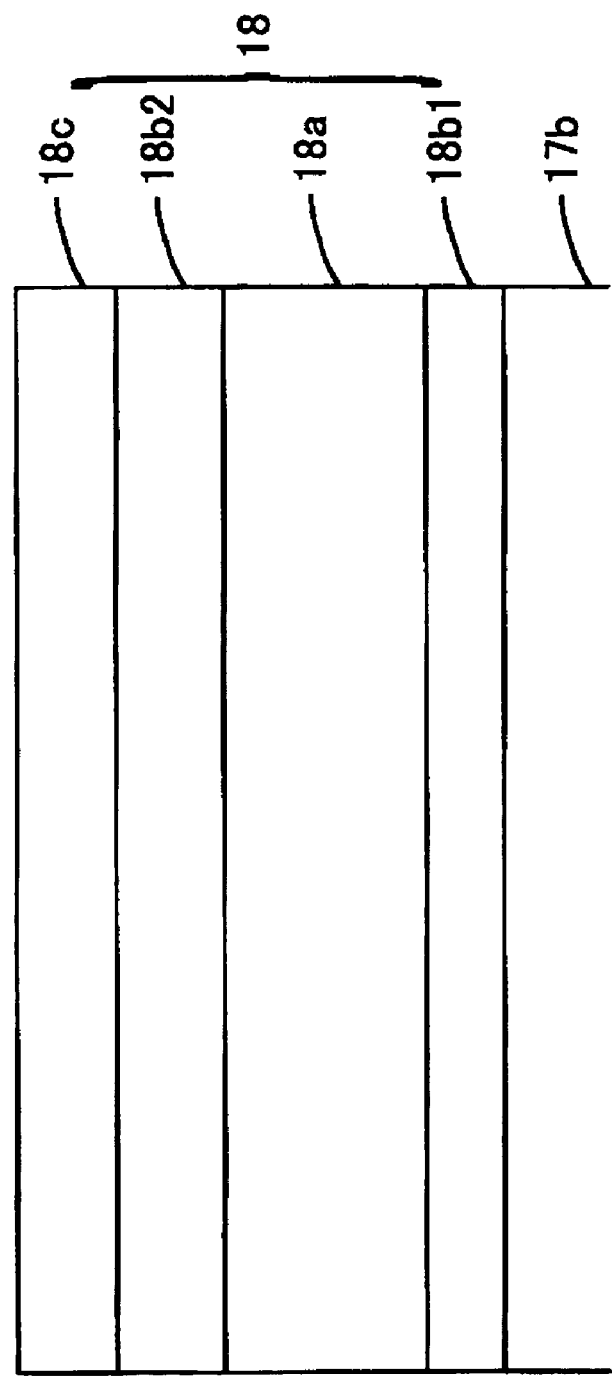
FIG. 2 is an exemplary typical side elevation of an electrode.

FIG. 2 typically shows the anode 18. Since the cathode 19 is similar in construction to the anode 18, the illustration and description thereof will be omitted. Referring to FIG. 2, the anode 18 consists of a Ag layer 18a of Ag, two protective layers 18b1 and 18b2 of Ti, and a Au layer 18c of Au (gold). First, the protective layer 18b1 is formed on the n-type semiconductor layer 17b and the Ag layer 18a is formed on the protective layer 18b1. Then, the protective layer 18b2 and the Au layer 18c are formed in that order on the Ag layer 18a. For example, the protective layer 18b1 is 2 nm in thickness, the Ag layer 18a is 100 nm in thickness, the protective layer 18b2 is 20 nm in thickness and the Au layer 18c is 300 nm in thickness. The Ag layer 18a does not necessarily need to be formed of only Ag. For example Cu and Pd may be added in contents of several percent to the Ag layer 18a to ensure the thermal and the chemical stability of the Ag layer 18a. The thermal and the chemical stability of the Ag layer 18a can be ensured by adding Bi in several percent to the Ag layer 18a.

A method of fabricating the daylight light-emitting diode 1 will be described. The fluorescent substrate 10 is formed by growing a single crystal of 6H-type SiC by a sublimation process while the crystal is being doped properly with B and N. Then, the fluorescent layer 11 is deposited on the fluorescent substrate 10 by step flow growing a single crystal of 6H-type SiC by a close sublimation process while the crystal is being properly doped with Al and N. Then, layers of AlGaN, GaN, GaInN/GaN, AlGaN, GaN and GaInN, namely, base materials, are grown sequentially by epitaxial grow by a close sublimation process while the layers are being doped properly with impurities specified respectively for the layers to superpose sequentially the buffer layer 12, the n-type contact layer 13, the multiple-quantum-well active layer 14, the electron blocking layer 15, the p-type connecting layer 17, and the tunnel junction layer 17 in that order. The crystal growth for the n-type semiconductor layer 17b containing InN in a molar fraction of 25% can be achieved at a comparatively low temperature.

After the semiconductor layers 10 to 17 have been thus formed, an upper part of the n-type contact layer 13, and parts of the multiple-quantum-well active layer 14, the electron blocking layer 15, the p-type connecting layer 16 and the tunnel junction layer 17 are removed by etching to expose a part of the upper surface of the n-type contact layer 13. Then, the anode 18 and the cathode 19 are formed on the n-type semiconductor layer 17b of the tunnel junction layer 17 and the exposed part of the n-type contact layer 13, respectively. Each of the anode 18 and the cathode 19 is formed by sequentially depositing Ti, Ag, Ti and Au layers in that order by, for example, an evaporation process. Needless to say, the anode 18 and the cathode 19 can be formed by a wet deposition process.

The daylight light-emitting diode 1 emits light when a forward bias voltage is applied across the anode 18 and the cathode 19 formed as described above. When the forward bias voltage is applied across the anode 18 and the cathode 19, a reverse bias voltage is applied to the tunnel junction layer 17 consisting of the p-type semiconductor layer 17a and the n-type semiconductor layer 17b forming a p-n junction. Consequently, a depletion layer is formed in the vicinity of the interface between the n-type semiconductor layer 17b and the protective layer 18b1 in contact with the n-type semiconductor layer 17b. Since the n-type semiconductor layer contains Si, namely, a donor impurity, in a high concentration not lower than $10^{19}$ cm$^{-3}$, the depletion layer has a small thickness on the order of 10 nm smaller than the thickness of the n-type semiconductor layer 17b.

The protective layer 18b1 of Ti can be brought substantially into ohmic contact with the n-type semiconductor layer 17b by tunnel effect. Since the n-type semiconductor layer 17b contains InN in a molar fraction of 25%, the n-type semiconductor layer 17b has a small bandgap on the order of 2.1 eV and a small strain owing to stress relaxation by low-temperature growth. Therefore, a tunnel current can be surely produced in the tunnel-junction layer 17 by a low voltage. Since Ti and Ag forming the anode 18 are metals having a small work function and the cathode 19 has a low resistance. Therefore, a tunnel current can be produced by a low voltage. Since the ohmic contact surface has a moderate resistance in the direction of the thickness, the tunnel junction layer 17 has a uniform current density with respect to the direction of the surface. Since a forward bias voltage is applied to the interface between the n-type contact layer 13 of n-GaN and the cathode 19, a current flows through the n-type contact layer 13 and the cathode 19.

A current can be made to flow from the anode 18 to the cathode 19 by applying the forward bias voltage across the anode 18 and the cathode 19. Thus, a current flows through the multiple-quantum-well active layer 14 and the electron blocking layer 15 formed between the anode 18 and the cathode 19 and, consequently, the multiple-quantum-well active layer 14 can be made to emit light. The multiple-quantum-well active layer 14 emits, for example, near ultraviolet radiation of 385 nm in wavelength. The near ultraviolet radiation radiated from the multiple-quantum-well active layer 14 travels through the fluorescent substrate 10 and the fluorescent layer 11 doped with the acceptor impurity and the donor impurity, respectively, and is absorbed by the fluorescent substrate 10 and the fluorescent layer 11. Donor electrons excited by the near ultraviolet radiation radiated from the multiple-quantum-well active layer 14 and acceptor holes recombine in the fluorescent substrate 10 and the fluorescent layer 11 to emit fluorescent light.

Both the base materials of the fluorescent substrate 10 and the fluorescent layer 11 are 6H-type SiC single crystals and basically have the same bandgap. However, the acceptor impurities added respectively to the fluorescent substrate 10 and the fluorescent layer 11 are different. That is, the fluorescent substrate 10 and the fluorescent layer 11 have different depths of acceptor level, respectively. Therefore, the fluorescent substrate 10 and the fluorescent layer 11 emit fluorescent light having a wavelength spectrum including wavelengths in different wavelength bands, respectively. The fluorescent substrate 10 containing boron as an acceptor impurity emits fluorescent light having a wide wavelength spectrum including wavelengths between green and red. The fluorescent 11 containing aluminum as an acceptor impurity emits fluorescent light having a wide wavelength spectrum including wavelengths between blue and green. The florescent light rays of those wavelengths are synthesized to produce white light satisfactory in color rendering. The white light is emitted outside through the lower surface of the fluorescent substrate 10 and is used for displaying and illumination.

The near ultraviolet radiation produced in the multiple-quantum-well active layer 14 travels downward or upward in the daylight light-emitting diode 1. The near ultraviolet radiation traveled downward in the multiple-quantum-well active layer 14 reaches the fluorescent layer 11 and the fluorescent substrate 10 and causes the fluorescent layer 11 and the fluorescent substrate 10 to emit fluorescent light. On the other hand, the near ultraviolet radiation that has traveled upward in the multiple-quantum-well active layer 14 and reached the anode 18 is completely reflected downward from the anode 18 and causes the fluorescent layer 11 and the fluorescent substrate 10 emit fluorescent light. Since the anode 18 has the Ag layer 18a having a very high reflectivity, the near ultraviolet radiation that has reached the anode 18 can be reflected downward scarcely causing loss. Thus the near ultraviolet radiation produced by the multiple-quantum-well active layer 14 can be efficiently converted into fluorescent light. Interfaces between the adjacent ones of the layers respectively having different refractive indices of the daylight light-emitting diode 1 reflect the light and part of the light reaches the cathode 19 in some cases. The cathode 19 made of the same material as the anode 18 can surely reflect the light reached thereto downward.

The Ag layer 18a is sandwiched between the protective layers 18b1 and 18b2. Thus the Ag layer 18a having a high reflectivity is coated with a Ti layer. The Ti layer is not porous like the Au layer and has packed construction. Therefore, oxygen that has permeated the Au layer 18c can be stopped by the protective layer 18b2 to prevent the oxygen from reaching the Ag layer 18a. Thus, the oxidation of the Ag layer 18 can be prevented and the reduction of the reflectivity of the Ag layer 18a with time can be prevented. Consequently, the daylight light-emitting diode 1 can maintain high light-emitting efficiency for a long time. Since the protective layer 18b1 on which light falls has a thickness of 2 nm, light permeates the protective layer 18b1 and can be reflected by the Au layer 18c. Since the Ag layer 18a has a thickness of 100 nm, light cannot permeate the Ag layer 18a and can be reflected at a high reflectivity.

Although the first embodiment employs the substrate of 6H-type SiC, a substrate of SiC of other polytype, such as a 4H-type, a 3C-type or a 15R-type, may be used. The use of a single-crystal substrate of, for example, sapphire is effective in achieving high efficiency and low voltage. The material of the anode 18 and the cathode 19 may be a material having a small work function and a high reflectivity other than Ag, such as Al. Although the first embodiment achieves light emission at a high efficiency by bonding the electron blocking layer 15 to the multiple-quantum-well active layer 14, other light-emitting structure, such as a double heterostructure, may be used.

(2) Second Embodiment

Figure 3:
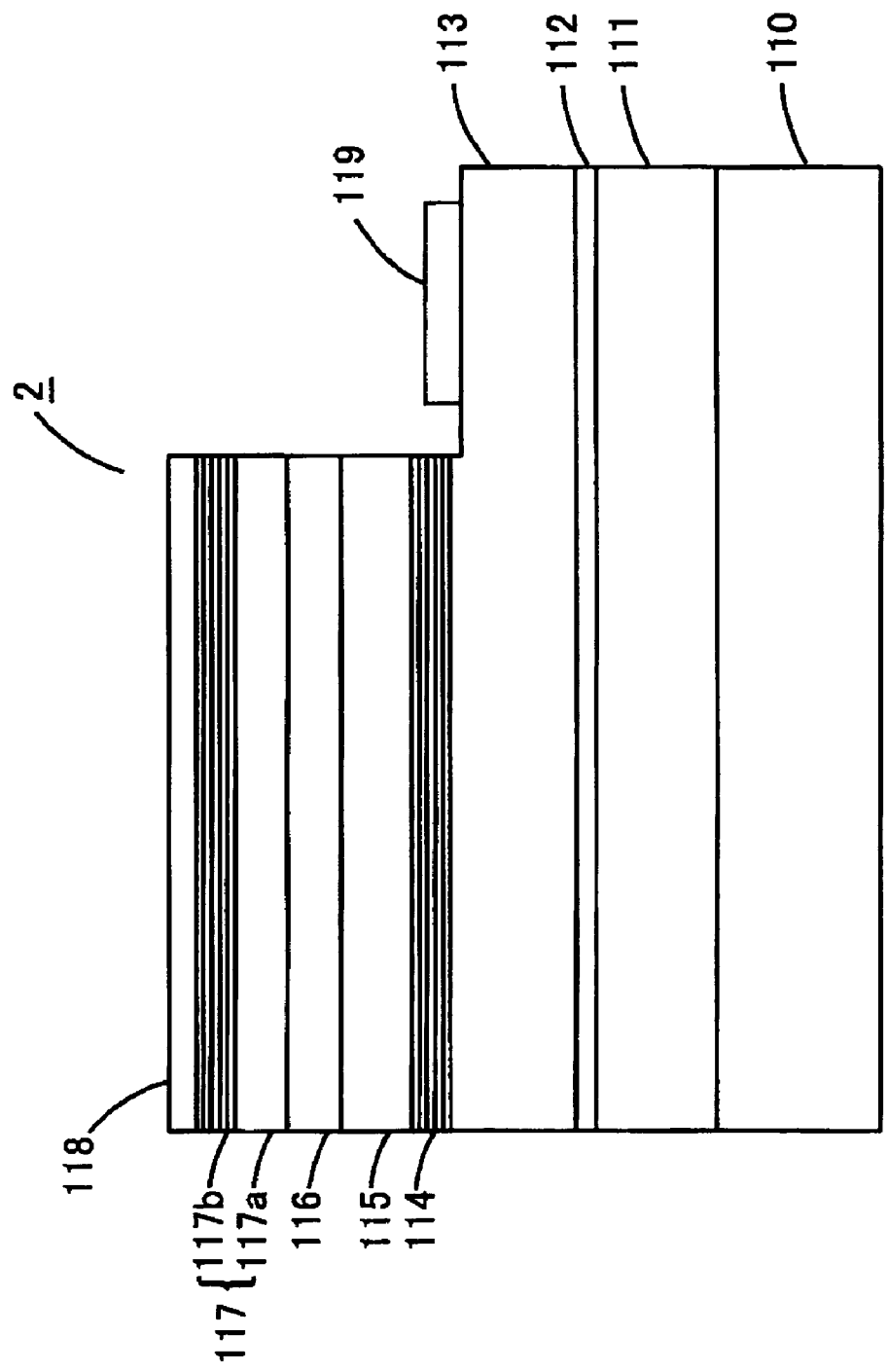
FIG. 3 is an exemplary typical side elevation of a daylight light-emitting diode.

FIG. 3 is a typical view of a daylight light emitting diode 2 in a second embodiment according to the present invention. Referring to FIG. 3, a daylight light-emitting diode 2 includes a fluorescent substrate 110, a fluorescent layer 111, a buffer layer 112, an n-type contact layer 113, a multiple-quantum-well active layer 114, an electron blocking layer 115, a p-type connecting layer 116, a tunnel-junction layer 117, an anode 118, and a cathode 119. The tunnel junction layer 117 consists of a p-type semiconductor layer 117a and an n-type semiconductor layer 117b. As shown in FIG. 3, the daylight light-emitting diode 2 in the second embodiment is substantially similar in construction to the daylight light-emitting diode 1 in the first embodiment, except that the daylight light-emitting diode 2 has a tunnel junction layer 117 having an n-type semiconductor layer 117b different from that of the daylight light-emitting diode 1. The n-type semiconductor layer 117b of the second embodiment has a multiple-quantum-well structure of n+-GaInN/GaN. The n-type semiconductor layer 17b contains Si as a donor impurity and Mg as an acceptor impurity. Whereas the Mg concentration is distributed substantially uniformly in the n-type semiconductor layer 117b, the Si concentration is higher than the Mg concentration by 1019 cm-3 or above only in the vicinity of the boundary surfaces of the n-type semiconductor layer 117b. Thus, the n-type semiconductor layer 117b has a high carrier concentration in the vicinity of its boundary surfaces.

Since the n-type semiconductor layer 117b has a high carrier concentration in its boundary surfaces and is in ohmic contact with an anode 118, a tunnel current can be produced, similarly to the first embodiment, in a tunnel junction layer 117 by applying a voltage across the anode 118 and a cathode 119. Thus a multiple-quantum-well active layer 114 formed between the anode 118 and the cathode 119 can emit near ultraviolet radiation.

Near ultraviolet radiation radiated downward from the multiple-quantum-well active layer 114 directly reaches the fluorescent substrate 110 and the fluorescent layer 111 to make the fluorescent substrate 110 and the fluorescent layer 11 produce fluorescent light. Near ultraviolet radiation radiated upward from the multiple-quantum-well active layer 114 reaches the n-type semiconductor layer 117 having multiple-quantum-well structure and containing Si, namely, a donor impurity, and Mg, namely, an acceptor impurity A narrow bandgap is formed in the n-type semiconductor layer 117b by forming the multiple-quantum-well structure of GaInN containing InN in a large molar fraction. Since Mg, namely, an acceptor impurity, has a high acceptor level, transition energy needed by the recombination of donor electrons excited by the near ultraviolet radiation and acceptor holes in the n-type semiconductor layer 117b can be reduced. Thus, the n-type semiconductor layer 117b can emit red fluorescent light having a long wavelength. Since the n-type semiconductor layer 117b has a multiple-quantum-well structure, the near ultraviolet radiation can be efficiently converted into fluorescent light by the confining effect of the donor electrons and the acceptor holes. Part around a boundary surface of the n-type semiconductor layer 117b forming the tunnel junction has a high carrier concentration, and the rest of the n-type semiconductor layer 117b has an impurity concentration suitable for the conversion of the near ultraviolet radiation to fluorescent light to achieve a high conversion efficiency. Therefore, the thickness of the n-type semiconductor layer 117b may be small.

The fluorescent substrate 110 produces fluorescent light having a wide wavelength spectrum including wavelengths between green and red. The n-type semiconductor layer 117b having a bandgap smaller than that of the fluorescent substrate 110 can produce reddish fluorescent light having long wavelengths. Thus, white light satisfactory in color rendering can be emitted by synthesizing the florescent light produced by the fluorescent substrate 110, the fluorescent light layer 111, and the n-type semiconductor layer 117b. Warm color illumination using light of a warm color having a color temperature on the order of 2800 K can be achieved y using the white light. The anode 118 and the cathode 119 of the second embodiment have construction similar to that shown in FIG. 2 of the anode 118 and the cathode 119 of the first embodiment. Therefore, the anode 118 and the cathode 119 can reflect light of those wavelength at a high reflectivity. Consequently, light can be emitted at a high efficiency from the fluorescent substrate 110. The n-type semiconductor layer 117b of the second embodiment can be in ohmic contact with the anode 118 and can produce fluorescent light of long wavelengths. Therefore, separate layers respectively for ohmic contact and long-wavelength light production do not need to be formed. Thus, the daylight light-emitting diode 2 can be manufactured at low material and manufacturing costs. The n-type semiconductor layer 117b corresponds to the fluorescent layer of the present invention.

(3) Third Embodiment

Figure 4:
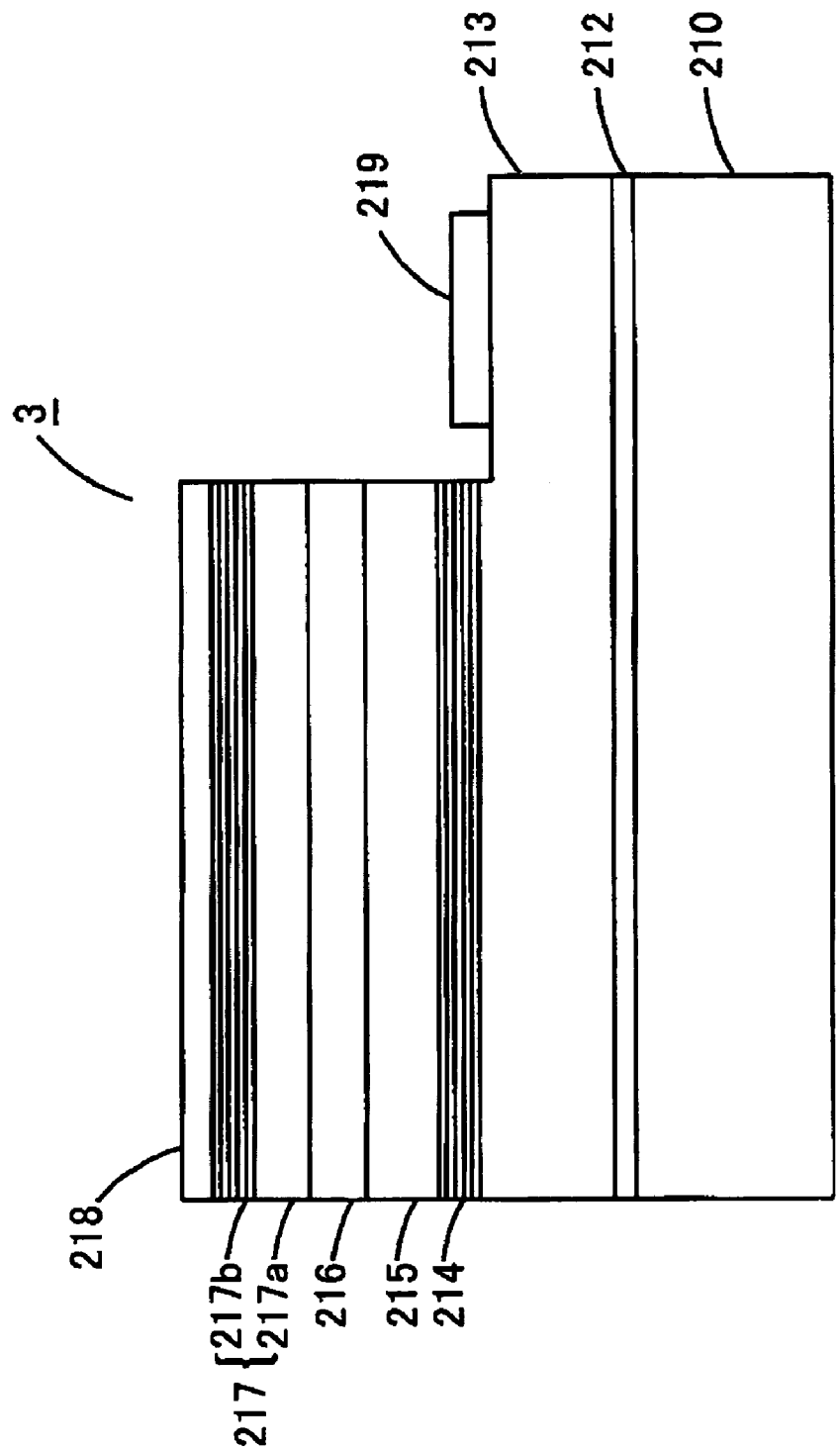
FIG. 4 is an exemplary typical side elevation of a daylight light-emitting diode.

FIG. 4 is a typical view of a daylight light emitting diode 3 in a third embodiment according to the present invention. Referring to FIG. 4, a daylight light-emitting diode 3 includes a fluorescent substrate 210, a buffer layer 212, an n-type contact layer 213, a multiple-quantum-well active layer 214, an electron blocking layer 215, a p-type connecting layer 216, a tunnel-junction layer 217, an anode 218, and a cathode 219. The tunnel junction layer 217 consists of a p-type semiconductor layer 217a and an n-type semiconductor layer 217b. As shown in FIG. 4, the daylight light-emitting diode 2 in the third embodiment is substantially similar in construction to the daylight light-emitting diode 3 in the second embodiment, except that the daylight light-emitting diode 3 does not have any layer corresponding to the fluorescent layer 111. In the third embodiment, a buffer layer 212 is formed on a fluorescent substrate 210. Since the fluorescent layer 111 is omitted, the daylight light-emitting diode 3 in the third embodiment, as compared with the daylight light-emitting diode 2 in the second embodiment, is apt to emit an insufficient amount of light rays having long wavelengths. The amount of long-wavelength components of fluorescent light produced by an n-type semiconductor layer 217b can be increased by adjusting the composition of GaInN/GaN forming the n-type semiconductor layer 217b. Thus, a deficiency in long-wave components due to the omission of the fluorescent layer 111 can be supplemented and well-balanced white light can be produced. More concretely, transition energy at which donor-acceptor pairs recombine can be suppressed by increasing the InN molar fraction of the n-type semiconductor layer 217b or by deepening the acceptor level to increase long-wavelength fluorescent light.

It is effective in supplementing the long-wave components of white light to insert a fluorescent layer having multiple-quantum-well structure of GaInN/GaN. The fluorescent layer does not necessarily contribute to ohmic contact between a semiconductor layer and an electrode. The color temperature of the white light can be adjusted to a color temperature of a warm color by inserting the fluorescent layer having multiple-quantum-well structure of GaInN/GaN into an optional position. FIG. 5 typically shows a daylight light-emitting diode 4 having a p-electrode and an n-electrode to p-type and n-type contact layers, respectively. The daylight light-emitting diode 4 has an n-contact layer 313 of n-GaN and a p-contact layer 317 of p-GaN. An n-electrode 319 is joined to the n-contact layer 313 and a p-electrode 318 is joined to the p-contact layer 317. The daylight light-emitting diode 4 has a fluorescent substrate 310, a buffer layer 312, a multiple-quantum-well active layer 314, and an electron blocking layer 315, which are the same in construction as those of the second embodiment.

The fluorescent layer 316 having multiple-quantum-well structure of GaInN/GaN is sandwiched between the electron blocking layer 315 and the p-contact layer 317. The fluorescent layer 316 is similar in construction to the n-type semiconductor layer 117b of the second embodiment. The fluorescent layer 316 contains Si, namely, a donor impurity, and Mg, namely, a donor impurity. The Si and the Mg concentration are determined such that the fluorescent layer 316 is a p-type fluorescent layer. The fluorescent layer 316 having multiple-quantum-well structure of GaInN/GaN can produce long-wavelength fluorescent light, and the daylight light-emitting diode 4 can emit white light tinged with a warm color.

(4) Conclusion

The anode 18 has the Ag layer 18a of Ag having a high reflectivity. The Ag layer 18a is sandwiched between the protective layers 18b1 and 18b2 each of Ti. The protective layer 18b1 is in ohmic contact with the tunnel-junction layer 17. The anode 18 formed of Ti/Ag having a small work function has a low resistance, and tunnel current flows through the tunnel-junction layer 17. The anode 18 and the cathode 19 can be formed of the same material, and can be formed of Ag having a high reflectivity. Consequently, the daylight light-emitting diode can emit light at a high light-emitting efficiency.

Although the invention has been described in considerable detail in language specific to structural features or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It is to be understood that the phraseology and terminology employed herein, as well as the abstract, are for the purpose of description and should not be regarded as limiting.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A light-emitting semiconductor device, comprising:
a first electrode that is made of a high reflective metal;
a second electrode;
a tunnel junction layer coupled in ohmic contact with the first electrode generates a tunnel current when a reverse bias voltage is applied between the first electrode and the second electrode; and
a light-emitting layer provided between the tunnel junction layer and the second electrode, wherein:
the tunnel junction layer includes a fluorescent layer where a first acceptor impurity and a first donor impurity are doped and generates a first fluorescent light in response to a light emitted by light-emitting layer.

* * * * *